United States Patent
Murata

(10) Patent No.: US 8,040,195 B2
(45) Date of Patent: Oct. 18, 2011

(54) CURRENT SOURCE DEVICE, OSCILLATOR DEVICE AND PULSE GENERATOR

(75) Inventor: Nobukazu Murata, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 181 days.

(21) Appl. No.: 12/175,484

(22) Filed: Jul. 18, 2008

(65) Prior Publication Data

US 2009/0072914 A1 Mar. 19, 2009

(30) Foreign Application Priority Data

Sep. 13, 2007 (JP) ................. 2007-237776

(51) Int. Cl.
*H03K 3/03* (2006.01)
(52) U.S. Cl. .......... 331/57; 331/185; 327/108; 327/109; 327/315; 327/538; 327/539; 327/543
(58) Field of Classification Search ............ 331/57, 331/185; 327/108, 109, 136, 312–316, 538–541, 327/543
See application file for complete search history.

(56) References Cited

U.S. PATENT DOCUMENTS

| | | | | |
|---|---|---|---|---|
| 5,905,759 A * | 5/1999 | Ishida et al. | | 375/282 |
| 6,111,456 A * | 8/2000 | Saito et al. | | 327/541 |
| 6,414,522 B1 * | 7/2002 | Nguyen et al. | | 327/101 |
| 6,734,719 B2 * | 5/2004 | Tanzawa et al. | | 327/541 |
| 7,133,751 B2 * | 11/2006 | Kurd et al. | | 700/293 |
| 7,190,234 B2 | 3/2007 | Isobe | | |
| 7,656,206 B2 * | 2/2010 | Omote | | 327/156 |
| 2005/0128019 A1 * | 6/2005 | Gou | | 331/185 |
| 2006/0049888 A1 * | 3/2006 | Gou et al. | | 331/185 |
| 2007/0057717 A1 * | 3/2007 | Choi | | 327/543 |

FOREIGN PATENT DOCUMENTS

JP 2005078510 3/2005

* cited by examiner

*Primary Examiner* — Arnold Kinkead
*Assistant Examiner* — Richard Tan
(74) *Attorney, Agent, or Firm* — Volentine & Whitt, PLLC

(57) ABSTRACT

A current source device that cuts off an output current when stopped and obtains a desired output current upon start-up includes a first circuit having a first FET and resistors in series, a second circuit having second and third FETs in series with a point between the second and third FETs and a gate of the third FET connected, a drive circuit supplying a common drive voltage to gates of the first and second FETs, and first and second current source circuits responsive to first and second drive voltages that are gate voltages of the second and third FETs. The first and second current source circuits respectively include first and second current source FETs having the first and second drive voltages as gate voltages, and a start-up circuit changing the first and second drive voltages forcedly when the first and second current source FETs are made conductive.

6 Claims, 8 Drawing Sheets

CURRENT SOURCE DEVICE, OSCILLATOR DEVICE AND PULSE GENERATOR

BACKGROUND OF THE INVENTION

The present invention relates to a current source device, an oscillator device and a pulse generator used in a semiconductor integrated circuit or the like.

A current source device configured as a basic circuit block is used in a semiconductor integrated circuit. The current source device supplies a predetermined current determined according to circuit constants to other circuit blocks or the like. A circuit example of a conventional current source device 100 is shown in FIG. 1. The current source device 100 comprises a reference voltage generating unit 110, a drive unit 120 and an output unit 130. The reference voltage generating unit 110 generates a reference voltage VREF for determining an output current by dividing a source voltage $V_{CC}$ with resistors. Incidentally, the reference voltage VREF is VREF=$V_{CC}$·R12/(R11+R12) in the circuit shown in FIG. 1. The reference voltage VREF is supplied to an inversion input terminal of an operational amplifier OP1 of the drive unit 120. An output terminal of the operational amplifier OP1 is connected to the gate of a PMOS transistor P11. The source of the PMOS transistor P11 is connected to the source voltage $V_{CC}$ and the drain thereof is connected to a resistor R13 whose one end is grounded. A potential developed at a connecting point of the drain of the PMOS transistor P11 (first FET) and the resistor R13 is connected to a non-inversion input terminal of the operational amplifier OP1. A PMOS transistor P12 (second FET) is connected to a gate line of the PMOS transistor P11. The source of the PMOS transistor P12 is connected to the source voltage $V_{CC}$ and the drain thereof is connected to its corresponding drain of an NMOS transistor N12 (third FET). Namely, the NMOS transistor N12 is connected in series with the PMOS transistor P12. The gate and drain of the NMOS transistor N12 are short-circuited to each other and the source thereof is grounded. Here, a current I11 that flows through the PMOS transistor P11 can be represented as I11=VREF/R13. On the other hand, if each transistor is used in a saturated region, then a relationship of I12∝I11 is established between the current I11 and a current I12 that flows through the PMOS transistor P12 and the NMOS transistor N12. A voltage $V_{BP}$ developed at a gate line for the PMOS transistors P11 and P12 is used as a gate voltage of a PMOS transistor P13 of the output unit 130, and a voltage $V_{BN}$ developed at a gate line for the NMOS transistor N12 is used as gate voltage of an NMOS transistor N13 of the output unit 130. The source of the PMOS transistor P13 of an output stage is connected to the source voltage $V_{CC}$ and the drain thereof serves as an output terminal OUT1. The source of the NMOS transistor N13 of the output stage is grounded and the drain thereof serves as an output terminal OUT2. With the connection of anther circuit block or the like between the output terminals OUT1 and OUT2 in the current source device 100 having such a configuration, a drive current corresponding to the reference voltage VREF can be supplied to the corresponding circuit block or the like. The current source device referred to above can be used as, for example, a drive current source of an oscillator device having a ring oscillator circuit comprised of inverter circuits of odd-numbered stages. In this case, drive currents are supplied from the current source device every plural inverter circuits constituting the ring oscillator circuit. The current source device can also be used as, for example, a drive current source of a pulse generator including a delay circuit comprised of inverter circuits of plural stages. Even in this case, drive currents are supplied from the current source device every plural inverter circuits constituting the delay circuit.

The above prior art refers to a patent document 1 (Japanese Unexamined Patent Publication No. 2000-78510).

In the above current source device, the condition for its normal operation is that the drive voltages $V_{BP}$ and $V_{BN}$ for driving the PMOS transistor P13 and NMOS transistor N13 of the output stage are respectively set to predetermined potentials. On the other hand, the setting of an output current in a halt state of the current source device to zero might be required depending on specs. In this case, however, it is considered that the drive voltage $V_{BP}$ of the PMOS transistor P13 of the output stage is set to the source voltage $V_{CC}$ to cut off the output current. Further, in this case, it is considered that $V_{BN}$ is set to a ground potential to avoid that the drive voltage $V_{BN}$ of the NMOS transistor N13 of the output stage reaches an indefinite voltage. Thus, there is a need to change the drive voltages $V_{BP}$ and $V_{BN}$ of the transistors of the output stage from the source voltage $V_{CC}$ or ground potential to predetermined potentials when the current source device is started from its halt state. It cannot be however expected that a desired output current is obtained during a period of transition made until $V_{BP}$ and $V_{BN}$ reach a predetermined voltage respectively. Namely, the period during which the required output current cannot be obtained exists immediately after the start-up of the current source device. Thus, in the oscillator device using the current source device as the drive current source as described above, a normal frequency output cannot be expected during a period taken until the output current reaches a predetermined value, after the start-up of the current source device. In the pulse generator using the current source device as the drive current source as mentioned above, a normal pulse output cannot be expected during a period taken until the output current reaches a predetermined value, after the start-up of the current source device.

SUMMARY OF THE INVENTION

The present invention has been made in view of the foregoing points. An object of the present invention is to provide a current source device capable of cutting off an output current at its stop and obtaining a desired output current immediately at its start-up.

Another object of the present invention is to provide an oscillator device which does not consume current at its stop and is capable of obtaining a desired frequency output at once after its start-up.

A further object of the present invention is to provide a pulse generator which does not consume current at its stop and is capable of obtaining a desired output pulse at once after its start-up.

According to one aspect of the present invention, for attaining the above object, there is provided a current source device comprising a first series circuit comprising a first FET and a resistor connected in series with the first FET and having both ends between which a source voltage is applied, a second series circuit which comprises a second FET and a third FET connected in series with the second FET and which includes a connecting point of the second and third FETs and a gate of the third FET both being short-circuited to each other and includes both ends between which the source voltage is applied, a drive circuit which supplies a common drive voltage to both gates of the first and second FETs, and first and second current source circuits operated in response to first and second drive voltages with gate voltages of the second and third FETs as the first and second drive voltages, wherein the first and second current source circuits respectively include first and second current source FETs respectively operated with the first and second drive voltages as gate voltages, and a start-up circuit which changes the first and second drive voltages forcedly when the first and second current source FETs are brought into conduction, and wherein output currents are supplied from sources or drains of the first and second current source FETs. Incidentally, a series connection of plural FETs means a connection configuration that the source or drain of one FET and the source or drain of the other FET are connected to each other.

According to another aspect of the present invention, for attaining the above object, there is provided an oscillator device having the above current source device including a ring oscillator circuit comprising a plurality of inverter circuits respectively operated with output currents supplied from the first and second current source FETs as drive current sources.

According to a further aspect of the present invention, for attaining the above object, there is provided a pulse generator having the above current source device, comprising a delay circuit comprising a plurality of inverter circuits respectively operated with the output currents supplied from the first and second current source FETs as drive current sources, and an AND circuit which receives both input and output signals of the delay circuit as input signals.

According to the current source device of the present invention, it is possible to stop a current output upon a circuit stop and obtain a desired output current at once from immediately after its start-up upon a circuit start-up.

According to the oscillator device of the present invention, it is possible to suppress power consumption upon a circuit stop and obtain a desired frequency output at once from immediately after its start-up upon a circuit start-up.

According to the pulse generator of the present invention, it is possible to suppress power consumption upon a circuit stop and obtain a desired pulse output at once from immediately after its start-up upon a circuit start-up.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
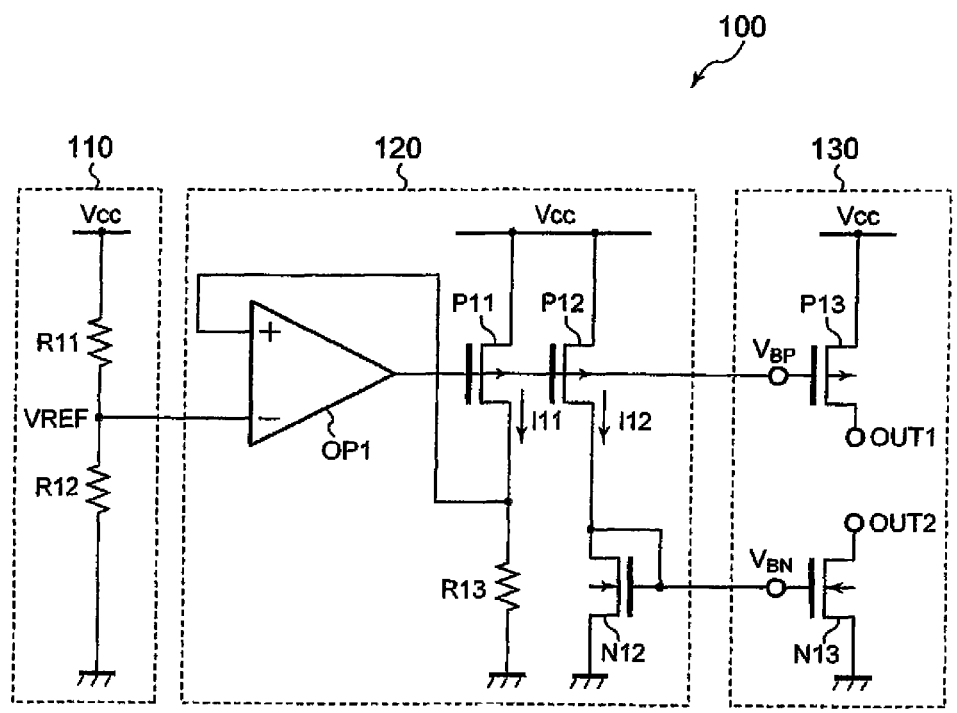
FIG. 1 is an equivalent circuit diagram showing a configuration example of a conventional current source device.

Preferred embodiments of the present invention will hereinafter be described with reference to the accompanying drawings. In the drawings shown below, the same reference numerals are respectively attached to substantially identical or equivalent constituent elements or parts.

First Preferred Embodiment

Figure 2:
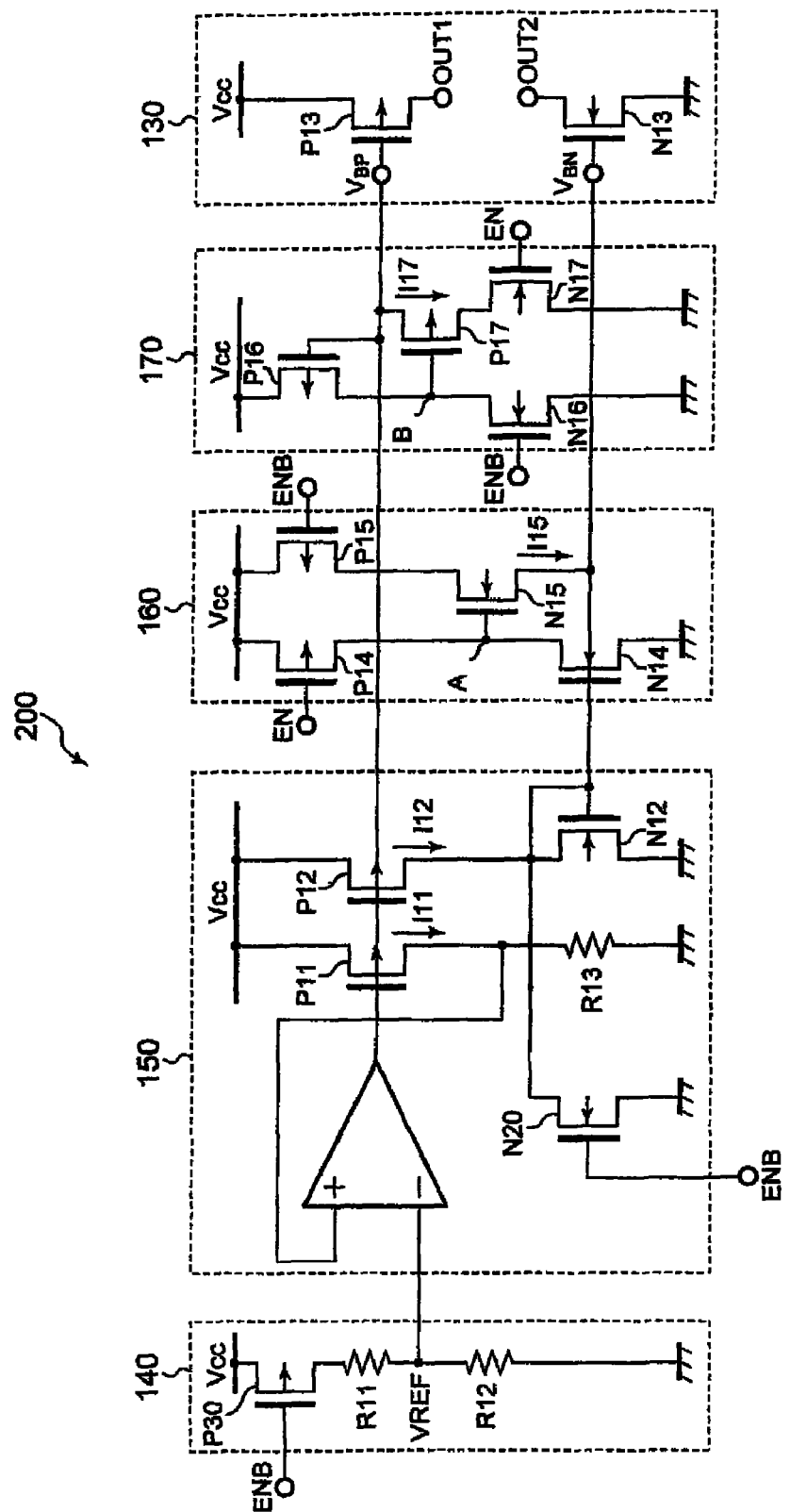
FIG. 2 is an equivalent circuit diagram illustrating a configuration of a current source device according to a first preferred embodiment of the present invention.

FIG. 2 is an equivalent circuit diagram showing a configuration of a current source device 200 of the present invention. The current source device 200 includes a reference voltage generating unit 140, a drive unit 150 and an output unit 130 in a manner similar to the conventional circuit. A $V_{BN}$ start circuit 160 and a $V_{BP}$ start circuit 170 are respectively connected to a $V_{BN}$ line and a $V_{BP}$ line that connect the drive unit 140 and the output unit 130. The current source device 200 of the present invention sets the potential of the $V_{BP}$ line to a source voltage $V_{CC}$ and sets the potential of the $V_{BN}$ line to a ground potential when it is held in a halt state. In this state, the current source device 200 brings transistors P13 and N13 of an output stage to an OFF state respectively to stop the supply of current. Upon its start-up, the current source device 200 is capable of causing both lines to reach a predetermined voltage momentarily and forcedly through the $V_{BN}$ start circuit 160 and the $V_{BP}$ start circuit 170 thereby to obtain a desired output current at once from immediately after the start-up. Detailed configurations of respective parts of the current source device 200 of the present invention will be explained below.

In a manner similar to the conventional circuit, the reference voltage generating unit 140 generates a predetermined reference voltage VREF by dividing the source voltage $V_{CC}$ by resistors R11 and R12. The reference voltage generating unit 140 of the present embodiment includes a PMOS transistor P30 inserted between the resistor R11 and the source voltage $V_{CC}$. The gate of the PMOS transistor is supplied with a start-up or enable signal ENB from outside, whereby ON/OFF control is done. Incidentally, the method of generating the reference voltage VREF is not limited to the resistance-division of the source voltage $V_{CC}$. The reference voltage VREF may be generated by, for example, a bandgap circuit or the like. In this case, a reference voltage stable with respect to the temperature can be obtained without depending on the source voltage $V_{CC}$. The reference voltage VREF generated by the reference voltage generating unit 140 is supplied to an inversion input terminal of an operational amplifier OP1 of the drive unit 150.

While the basic configuration of the drive unit 150 is similar to the conventional circuit, the drain of an NMOS transistor N20 (fourth FET) is connected to a connecting point of a PMOS transistor P12 and an NMOS transistor N12, i.e., the $V_{BN}$ line. The source of the NMOS transistor N20 is grounded and the gate thereof is supplied with the enable signal ENB from outside, whereby ON/OFF control is performed.

The $V_{BN}$ start circuit 160 comprises four transistors of PMOS transistors P14 and P15 and NMOS transistors N14 and N15. The gate of the NMOS transistor N14 is connected to the $V_{BN}$ line, the source thereof is grounded and the drain thereof is connected to the gate of the NMOS transistor N15 and the drain of the PMOS transistor P14 at a point A in the drawing. The source of the NMOS transistor N15 is connected to the $V_{BN}$ line and the drain thereof is connected to the drain of the PMOS transistor P15. The source of the PMOS transistor P14 is connected to the source voltage $V_{CC}$ and the gate thereof is supplied with an enable signal EN from outside, whereby ON/OFF control is conducted based on the enable signal EN. The source of the PMOS transistor P15 is connected to the source voltage $V_{CC}$ and the gate thereof is supplied with the enable signal ENB, so that ON/OFF control is done based on the enable signal ENB. Incidentally, the PMOS transistor P14 corresponds to a second gate potential fixing FET of the present application, the PMOS transistor P15 corresponds to a second current control FET of the present application, the NMOS transistor N14 corresponds to a second gate control FET of the present application, and the NMOS transistor N15 corresponds to a second drive voltage start-up FET of the present application.

The $V_{BP}$ start circuit 170 comprises four transistors of PMOS transistors P16 and P17 and NMOS transistors N16 and N17. The source of the PMOS transistor P16 is connected to the source voltage $V_{CC}$, the gate thereof is connected to the $V_{BP}$ line and the drain thereof is connected to the gate of the PMOS transistor P17 and the drain of the NMOS transistor N16 at a point B in the figure. The source of the PMOS transistor P17 is connected to the $V_{BP}$ line and the drain thereof is connected to the drain of the NMOS transistor N17. The source of the NMOS transistor N16 is grounded and the gate thereof is supplied with the enable signal ENB, so that ON/OFF control is performed based on the enable signal ENB. The source of the NMOS transistor N17 is grounded and the gate thereof is supplied with the enable signal EN, so that ON/OFF control is done based on the enable signal EN. Incidentally, the PMOS transistor P16 corresponds to a first gate control FET of the present application, the PMOS transistor P17 corresponds to a first drive voltage start-up FET of the present application, the NMOS transistor N16 corresponds to a first gate potential fixing FET of the present application, and the NMOS transistor N17 corresponds to a first current control FET of the present application.

The source of a PMOS transistor P13 of the output unit 130 is connected to the source voltage $V_{CC}$, the gate thereof is connected to the $V_{BP}$ line and the drain thereof serves as an output terminal OUT1. The source of an NMOS transistor N13 of the output unit 130 is grounded, the gate thereof is connected to the $V_{BN}$ line and the drain thereof serves as an output terminal OUT2.

Connecting other circuit blocks or the like between the output terminals OUT1 and OUT2 in the current source device 100 having such a configuration makes it possible to supply a drive current corresponding to the reference voltage VREF to the corresponding circuit block or the like. The operation of the current source device 200 will be explained below.

When the current source device 200 is in a halt state, the enable signal EN is set to a Low level and the enable signal ENB is set to a High level in order to bring an output current to zero. Here, the Low level is of a ground potential level and the High level is of a source voltage $V_{CC}$ level.

When the enable signal ENB is brought to the High level, the PMOS transistor P30 of the reference voltage generating unit 140 becomes an OFF state. Therefore, the reference voltage VREF assumes the ground potential, the output voltage of the operational amplifier OP1 assumes the source voltage $V_{CC}$ level, and the $V_{BP}$ line assumes the source voltage $V_{CC}$ level. Hence, the PMOS transistor P13 of the output unit 130 is brought to an OFF state so that the output current is brought to zero. When the enable signal ENB is brought to the High level, the NMOS transistor N20 of the drive unit 150 is brought to an ON state. Therefore, the $V_{BN}$ line is brought to the ground potential level and the NMOS transistor N13 of the output unit 130 is also brought to an OFF state. Thus, when the current source device 200 is in the halted state, the PMOS transistor P13 and NMOS transistor N13 of the output unit 130 are respectively driven to an OFF state, so that the supply of the output current is stopped.

In the $V_{BN}$ start-up circuit 160, the PMOS transistor P14 is brought to an ON state when the enable signal EN reaches the Low level, whereas when the enable signal ENB is brought to the High level, the PMOS transistor P15 is brought to an OFF state. Since the $V_{BN}$ line is of the ground potential level as mentioned above, the NMOS transistor N14 is brought to an OFF state so that the potential at the point A assumes the source voltage $V_{CC}$ level. Therefore, since the PMOS transistor P15 is in the OFF state while the NMOS transistor N15 is brought to an ON state, no current flows.

In the $V_{BP}$ start-up circuit 170, the NMOS transistor N17 is brought to an OFF state when the enable signal EN reaches the Low level, whereas when the enable signal ENB is brought to the High level, the NMOS transistor N16 is brought to an ON state. Since the $V_{BP}$ line is of the source voltage $V_{CC}$ level as mentioned above, the PMOS transistor P16 is brought to an OFF state so that the potential at the point B assumes the ground potential level. Therefore, since the NMOS transistor N17 is in the OFF state while the PMOS transistor P17 is brought to an ON state, no current flows.

Next, when the current source device 200 is started, the enable signal EN is set to the High level and the enable signal ENB is set to the Low level. When the enable signal ENB is brought to the Low level, the PMOS transistor P30 of the reference voltage generating unit 140 is brought to an ON state, so that the reference voltage VREF determined by a resistance division ratio of the resistors R11 and R12 occurs at a connecting point of these resistors. This is supplied to the inversion input terminal of the operational amplifier OP1. Thus, the potential of the $V_{BP}$ line that has been maintained at the source voltage $V_{CC}$ level in the halt state starts to drop. With its drop, the PMOS transistors P11 and P12 are brought to an ON state so that currents I11 and I12 start to flow. On the other hand, when the enable signal ENB is brought to the Low level, the NMOS transistor N20 of the drive unit 150 is brought to an OFF state. Therefore, the potential of the $V_{BN}$ line that has been maintained at the ground potential level in the halt state starts to rise.

With its drop, the PMOS transistors P11 and P12 are brought to an ON state so that currents I11 and I12 start to flow. On the other hand, when the enable signal ENB is brought to the Low level, the NMOS transistor N20 of the drive unit 150 is brought to an OFF state. Therefore, the potential of the $V_{BN}$ line that has been maintained at the ground potential level in the halt state starts to rise.

When the enable signal EN is brought to the High level and the enable signal ENB is brought to the Low level in the $V_{BN}$ start-up circuit 160, the PMOS transistor P14 is brought to an OFF state and the PMOS transistor P15 is brought to an ON state. Since the $V_{BN}$ line is at the ground potential level immediately after the start-up of the current source device 200, the NMOS transistor N14 is held in an OFF state and the potential at the point A is maintained at the source voltage $V_{CC}$ level. Thus, since the NMOS transistor N15 is continuously held in the ON state immediately after the start-up, and the PMOS transistor P15 is brought to the ON state by the enable signal ENB as described above, a current I15 flows and the potential of the $V_{BN}$ line rises suddenly. With the sudden rise in the potential of the $V_{BN}$ line after the start-up, the NMOS transistor N13 of the output unit 130 is transitioned to an ON state rapidly and brought to a state of being capable of supplying a predetermined output current from immediately after the start-up of the current source device 200. Incidentally, when the NMOS transistor N14 is brought to an ON state with the rise in the potential of the $V_{BN}$ line, the potential at the point A reaches the ground potential level and the NMOS transistor N15 is brought to an OFF state. Therefore, the potential that the $V_{BN}$ line reaches is in the neighborhood of the threshold voltage of the NMOS transistor N14 by the operation of the $V_{BN}$ start-up circuit 160.

When the enable signal EN is brought to the High level and the enable signal ENB is brought to the Low level in the $V_{BP}$ start-up circuit 170, the NMOS transistor N16 assumes an OFF state and the NMOS transistor N17 assumes an ON state. Since the $V_{BP}$ line is placed in the source voltage $V_{CC}$ level immediately after the start-up, the PMOS transistor P16 is brought to an OFF state and the potential at the point B is maintained at the ground potential level. Thus, since the PMOS transistor P17 is continuously held in the ON state and the NMOS transistor N17 is brought to the ON state by the enable signal EN as described above, a current I17 flows and the potential of the $V_{BP}$ line drops suddenly. With the sudden drop in the potential of the $V_{BP}$ line after the start-up, the PMOS transistor P13 of the output unit 130 is transitioned to an ON state rapidly and assumes a state of being capable of supplying a predetermined output current from immediately after the start-up of the current source device 200. Incidentally, when the PMOS transistor P16 is brought to an ON state with the drop in the potential of the $V_{BP}$ line, the potential at the point B reaches the source voltage $V_{CC}$ level and the PMOS transistor P17 is brought to an OFF state. Therefore, the potential that the $V_{BP}$ line reaches is in the neighborhood of the threshold voltage of the PMOS transistor N16 by the operation of the $V_{BP}$ start-up circuit 170.

Figure 3A:
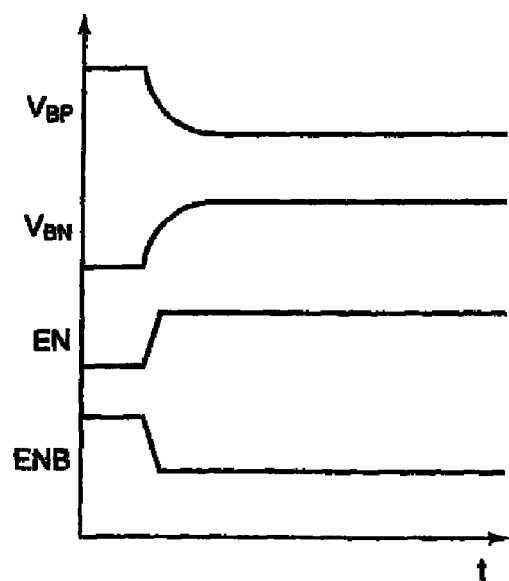
FIG. 3(a) is a diagram showing operation waveforms of respective parts in the conventional current source device.
Figure 3B:
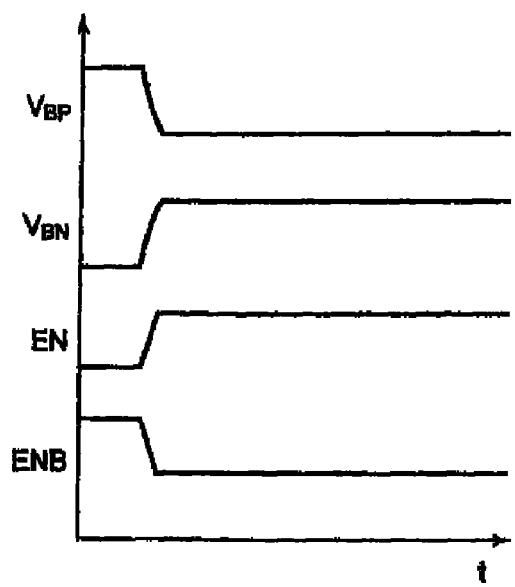
FIG. 3(b) is a diagram showing operation waveforms of respective parts in the current source device according to the first preferred embodiment of the present invention.

FIG. 3(a) shows changes in voltages of $V_{BN}$ and $V_{BP}$ lines at the start-up of the conventional current source device with no $V_{BN}$ start-up circuit 160 and $V_{BP}$ start-up circuit 170. On the other hand, FIG. 3(b) shows changes in voltages of the $V_{BN}$ and $V_{BP}$ lines at the start-up of the current source device 200 according to the present invention, including the $V_{BN}$ start-up circuit 160 and the $V_{BP}$ start-up circuit 170. In the conventional current source device, a certain amount of time is required until $V_{BN}$ and $V_{BP}$ reach a predetermined voltage after its start-up as shown in FIG. 3(a). Therefore, the transistors of the output stage operated with $V_{BP}$ and $V_{BN}$ as drive voltages are not capable of passing predetermined output currents immediately after the start-up. On the other hand, in the current source device 200 according to the present invention, including the $V_{BN}$ start-up circuit 160 and the $V_{BP}$ start-up circuit 170, as shown in FIG. 3(b), the potential of the $V_{BP}$ line maintained at the source voltage $V_{CC}$ level at its stop drops suddenly from immediately after the start-up thereof due to the operations of these start-up circuits and reaches a predetermined voltage level rapidly. The potential of the $V_{BN}$ line maintained at the ground potential level upon its stop rises suddenly from immediately after the start-up and reaches a predetermined voltage level rapidly. Thus, the PMOS transistor P13 and NMOS transistor N13 of the output unit 130, which have been held in the OFF state in the halt state, are respectively transitioned to an ON state rapidly, and are capable of passing desired output currents momentarily. Incidentally, while the potential that the $V_{BN}$ line reaches is in the neighborhood of the threshold voltage of the NMOS transistor N14 by the operation of the $V_{BN}$ start-up circuit as described above, and the potential that the $V_{BP}$ line reaches is in the neighborhood of the threshold voltage of the PMOS transistor P16 by the operation of the $V_{BP}$ start-up circuit, the changes in the voltages of the $V_{BN}$ and $V_{BP}$ lines are greatly speeded up compared with the conventional or prior art circuit even in such a case, and the current source device can be enabled or started up at a high speed.

Second Preferred Embodiment

Figure 4:
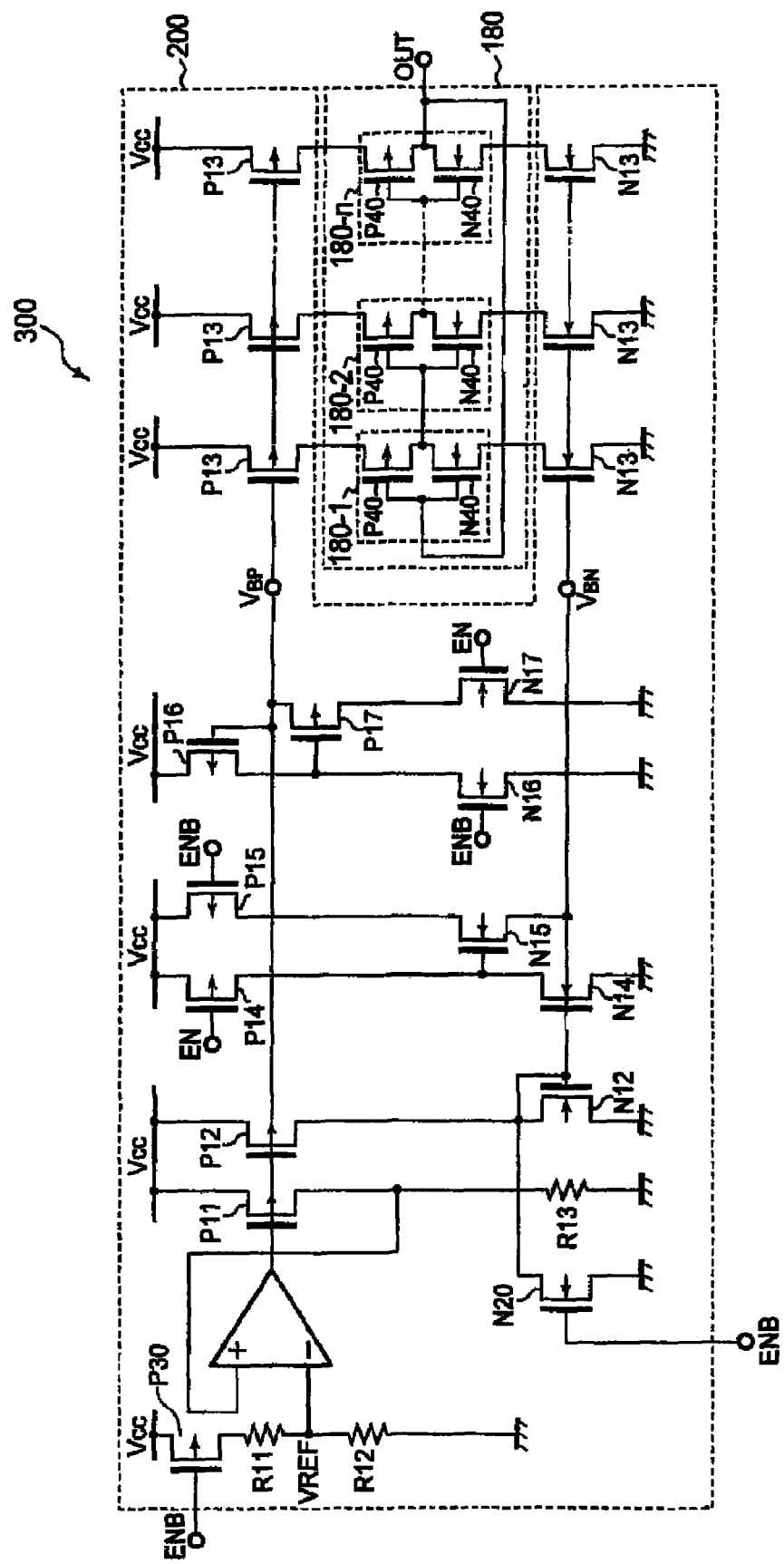
FIG. 4 is an equivalent circuit diagram illustrating a configuration of an oscillator device according to a second preferred embodiment of the present invention.

FIG. 4 is an equivalent circuit diagram showing a configuration of an oscillator device 300 illustrative of a second preferred embodiment of the present invention to which the current source device 200 shown in the first preferred embodiment is applied. The oscillator device 300 has a configuration in which a ring oscillator circuit 180 is added to the current source device 200. That is, the ring oscillator circuit 180 is operated in response to the supply of drive currents from the current source device 200.

The ring oscillator circuit 180 comprises inverter circuits 180-1 through 180-n of n stages (where n: odd number) coupled to one another. Each of the inverter circuits 180-1 through 180-n comprises a PMOS transistor P40 and an NMOS transistor N40. Each inverter circuit is supplied with drive currents by output-stage transistors P13 and N13 of the current source device. Incidentally, the output-stage transistors P13 and N13 are increased according to the number of stages of the inverter circuits. The output of the final-stage inverter circuit 180-n is taken out as the final output voltage of the oscillator device 300. The output of the inverter circuit 180-n is connected to the input of the first-stage inverter circuit 180-1. The inverter circuits comprised of the odd-numbered stages assume a logical NOT of the input as a whole. Since the inverter circuits have finite delay times respectively, the final-stage inverter circuit 180-n outputs a logical NOT of the first-stage input after the finite delay times have elapsed from the input to the first-stage inverter circuit 180-1, and the logical NOT thereof is inputted to the first-stage inverter circuit 180-1 again. This process is repeated, thereby making it possible to obtain an oscillation signal from an output terminal OUT. Since the current source device 200 is similar in configuration and operation to the first preferred embodiment, their explanations are omitted.

Thus, according to the oscillator device of the present invention, the ring oscillator circuit 180 is configured so as to be supplied with the drive currents from the current source device 200 according to the present invention. Therefore, when the entire circuit is in a halt state, the supply of the drive currents therefrom is not conducted and power consumption can hence be reduced. Since desired drive currents are supplied from the current source device 200 to the ring oscillator circuit 180 rapidly from immediately after its start-up upon start-up of the circuit, an output signal having a stable oscillation frequency can be obtained from immediately after the start-up. The oscillator device 300 according to the present invention can be used in, for example, an internal clock circuit of a semiconductor memory circuit requiring that a standby current prior to the start-up is zero.

Third Preferred Embodiment

Figure 5:
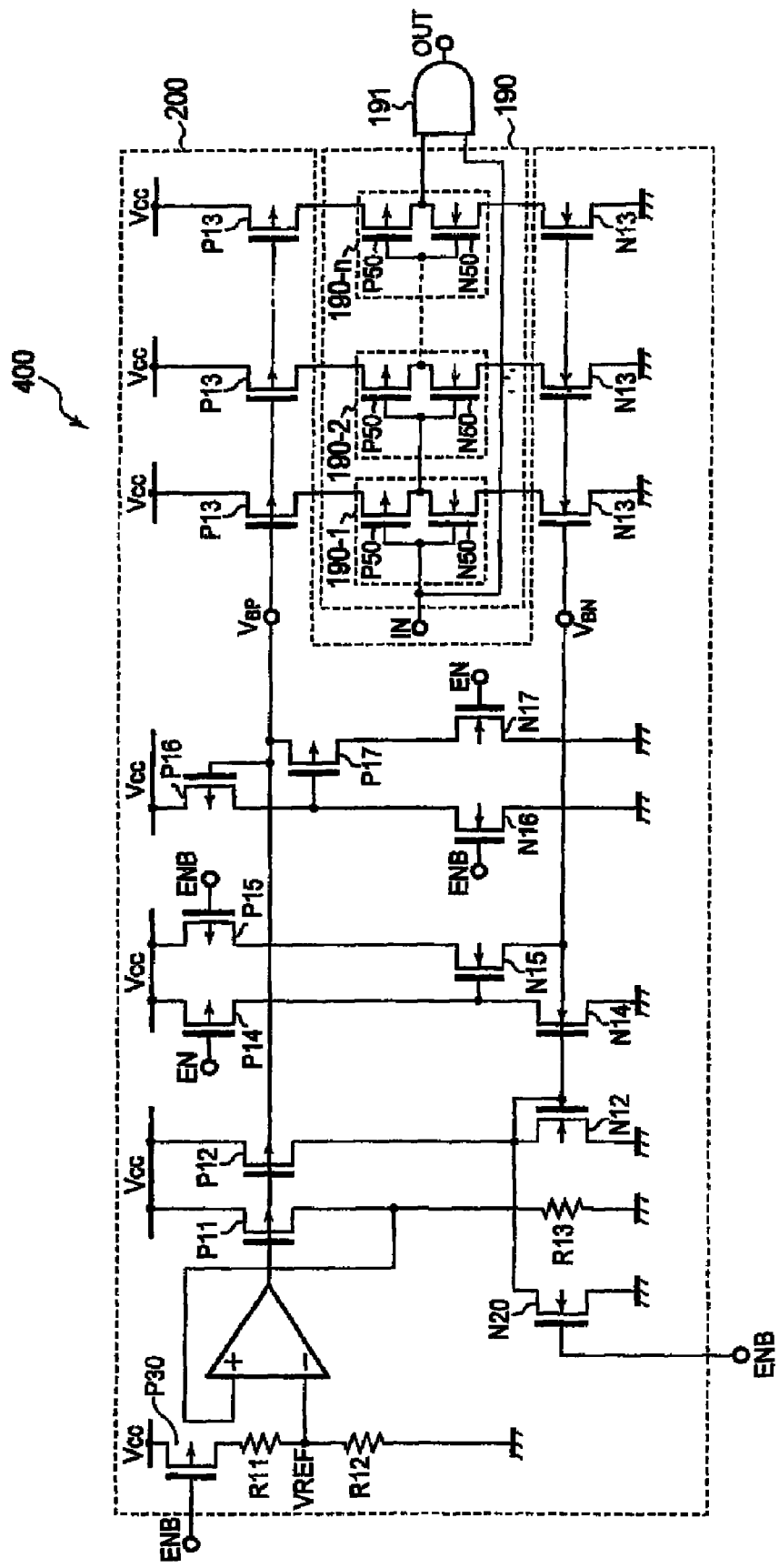
FIG. 5 is an equivalent circuit diagram depicting a configuration of a pulse generator according to a third embodiment of the present invention.

FIG. 5 is an equivalent circuit diagram showing a configuration of a pulse generator 400 illustrative of a third preferred embodiment of the present invention to which the current source device 200 illustrated in the first preferred embodiment is applied. The pulse generator 400 comprises the current source device 200, a delay circuit 190 made up of inverter circuits 190-1 through 190-n of n stages (where n: odd number), and an AND circuit 191. Each of the inverter circuits 190-1 through 190-n is operated in response to the supply of drive currents from the current source device 200. The output of the final-stage inverter circuit 190-n is connected to one input of the AND circuit 191. The input of the first-stage inverter circuit 190-1 is connected to the other input of the AND circuit 191. An output of the AND circuit 191 is taken out as a final output of the pulse generator 400. With the supply of an input signal of a Low level to an input terminal IN connected to the first-stage inverter circuit 190-1 in the pulse generator 400 having such a configuration, a Low level is supplied to the one input of the AND circuit 191 and thereby the AND circuit 191 outputs the Low level therefrom. Since, at this time, the final-stage inverter circuit 190-n outputs a High level, the High level is supplied to the other input of the AND circuit 191. On the other hand, when the High level is supplied to the input terminal IN, the High level is temporarily supplied to both inputs of the AND circuit 191. Therefore, the AND circuit 191 outputs the High level therefrom. Since the final-stage inverter circuit 190-n outputs the Low level when a predetermined delay time determined according to the number of stages of the inverter circuits has elapsed, the output of the AND circuit 191 is brought to the Low level after the delay time has elapsed. Namely, the pulse generator 400 changes the input signal from the Low level to the High level thereby to generate an output pulse having a pulse width corresponding to a delay in propagation by the delay circuit 190 comprised of the inverter circuits of plural stages. Incidentally, since the current source device is similar to the first preferred embodiment in configuration and operation, their explanations are omitted.

Thus, according to the pulse generator of the present invention, each of the inverter circuits of the plural stages constituting the delay circuit 190 is configured so as to be supplied with the drive currents from the current source device 200 according to the present invention. Therefore, when the whole circuit is in a halt state, the supply of the drive currents therefrom is not conducted and power consumption can hence be reduced. Since desired drive currents are supplied from the current source device to the respective inverter circuits rapidly from immediately after its start-up upon start-up of the circuit, an output pulse having a stable pulse width can be obtained from immediately after the start-up. The pulse generator 400 according to the present invention can be used in, for example, a pulse generator with an address transition as a trigger in a semiconductor memory circuit requiring that a standby current prior to the start-up is zero.

First Modification

Figure 6:
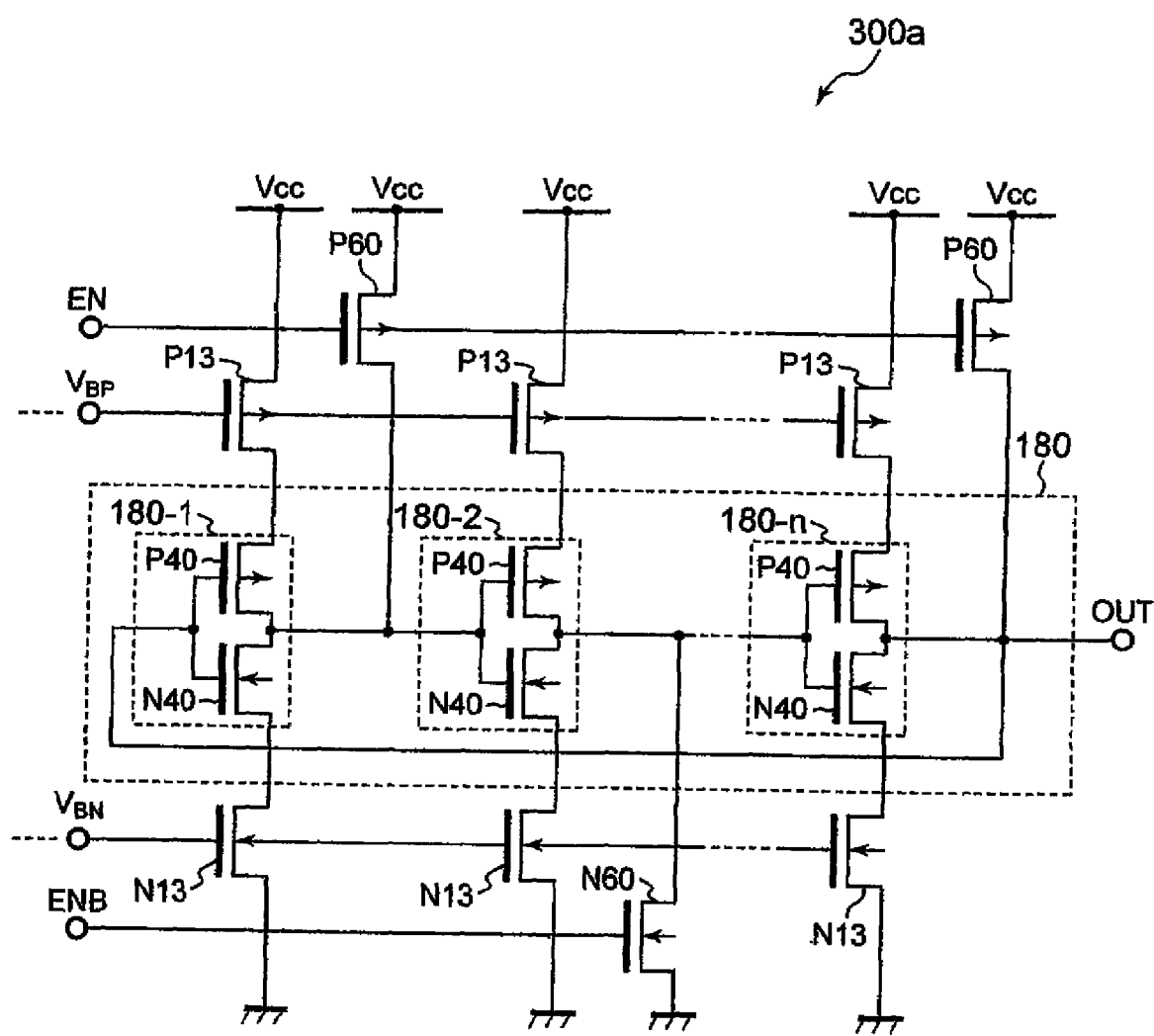
FIG. 6 is an equivalent circuit diagram showing a configuration of an oscillator device according to another embodiment of the present invention.

FIG. 6 is an equivalent circuit diagram showing a modification of the ring oscillator device 300 shown in the second preferred embodiment. In a ring oscillator device 300a according to the present embodiment, the drains of potential fixing PMOS transistors P60 are connected to their corresponding outputs of odd-numbered inverter circuits of inverter circuits 180-1 through 180-n of n stages (where n: odd number). The sources of the PMOS transistors P60 are connected to a source voltage $V_{CC}$ and the gates thereof are supplied with an enable signal EN from outside. On the other hand, the drains of potential fixing NMOS transistors N60 are connected to their corresponding outputs of the even-numbered inverter circuits. The sources of the NMOS transistors N60 are connected to a ground potential and the gates thereof are supplied with an enable signal ENB from outside. Since the present embodiment is similar to the second preferred embodiment in other constituent parts, their explanations are omitted. Incidentally, descriptions about the constituent parts of the current source device 200 are omitted in FIG. 6.

When the ring oscillator device 300a having such a configuration is in a halt state, the enable signal EN is set to a Low level and the enable signal ENB is set to a High level. Thus, the potential fixing PMOS transistors P60 and the NMOS transistors N60 are both brought to an ON state, so that the outputs of the odd-numbered inverter circuits are fixed to the High level and the outputs of the even-numbered inverter circuits are fixed to the Low level. Namely, when the oscillator device 300a is in the halt state, the potential is fixed in such a manner that the High and Low levels alternately appear at connecting points of the respective inverter circuits. Incidentally, the input and output of the first-stage inverter circuit 180-1 are both fixed to the High level. Since the potential of a $V_{BN}$ line is of a ground potential level in the halt state as described above, N13 are held in an OFF state and hence no through current flows. By fixing the input and output voltages of the respective inverter circuits in the halt state of the oscillator device 300a, a stable frequency output can be obtained from immediately after the start-up of the oscillator device. Namely, the state of the potential at the input/output point of each inverter circuit in the halt state corresponds to a momentary state in which the input of the first-stage inverter circuit 180-1 is inverted to the High level upon the normal operation of the oscillator device. That is, since the potential of each part is fixed in such a manner that the oscillator device takes one state at the time that it is already in the normal operation, from the time when the oscillator device is in the halt state, and the supply of drive currents is started by the operation of the current source device 200 from immediately after the start-up thereof, a desired frequency output is obtained promptly from immediately after the start-up. Incidentally, when the oscillator device is started, the enable signal EN is set as the High level, the enable signal ENB is set as the Low level and the potential fixing transistors P60 and N60 are respectively brought to an OFF state. In this state, the fixing of each potential is released.

Figure 7:
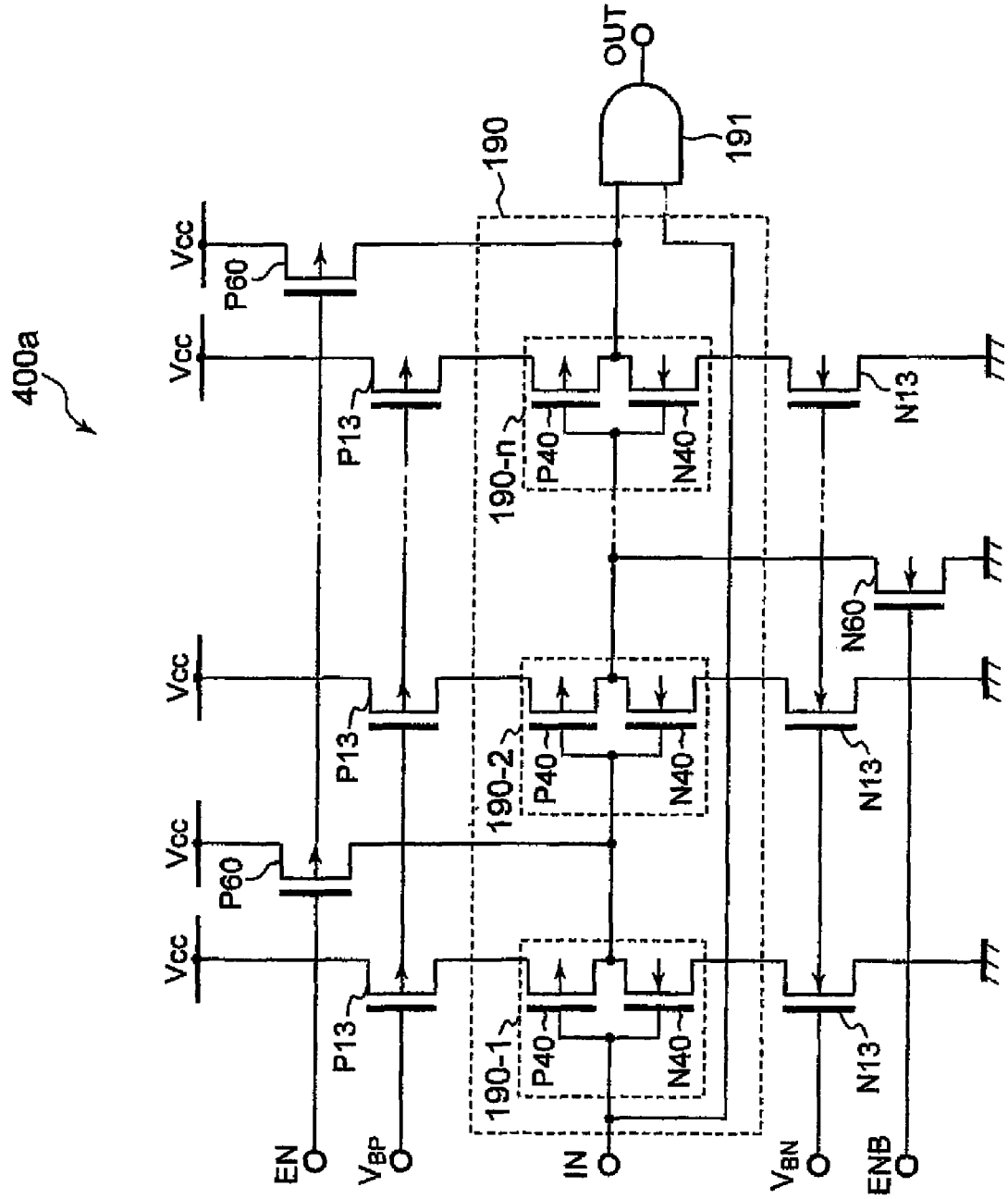
FIG. 7 is an equivalent circuit diagram illustrating a configuration of a pulse generator according to another embodiment of the present invention.

FIG. 7 is an equivalent circuit diagram showing a modification of the pulse generator 400 illustrated in the third preferred embodiment. The above-described potential fixing transistors can be applied even to the pulse generator 400 shown in the third preferred embodiment. Namely, in a pulse generator 400a according to the present embodiment, potential fixing PMOS transistors P60 and NMOS transistors N60 are alternately disposed at respective outputs of inverter circuits 190-1 through 190-n constituting a delay circuit 190 in a manner similar to the above oscillator device 300a.

Incidentally, the constituent parts of the current source device 200 have not been described in FIG. 7. In the pulse generator having such a configuration, an enable signal EN is set to a Low level and an enable signal ENB is set to a High level when the pulse generator is in a halt state. Thus, the potential fixing PMOS transistors P60 and NMOS transistors N60 are both brought to an ON state, so that the outputs of the odd-numbered inverter circuits are fixed to a High level and the outputs of the even-numbered inverter circuits are fixed to a Low level. Further, an input terminal IN is set to a Low level in the halt state. Thus, the potentials of the inputs and outputs of all the inverter circuits become opposite in phase. The output of an AND circuit 191 becomes a Low level because the input terminal IN is set the Low level. The state of the potential of each part at the stop of the pulse generator corresponds to a state at the time that the input terminal IN is of the Low level upon the normal operation of the pulser generator. Thus, it corresponds to a state prior to the input of a trigger for pulse generation. Namely, since the potential of each part is fixed in such a manner that the pulse generator 400a takes one state at the time that it is already in the normal operation, from the time when the pulse generator is in the halt state, and the supply of drive currents is started by the operation of the current source device 200 from immediately after the start-up thereof, a desired pulse output is obtained promptly from immediately after the start-up. Incidentally, when the pulse generator is started, the enable signal EN is set as the High level, the enable signal ENB is set as the Low level and the potential fixing transistors P60 and N60 are respectively brought to an OFF state. In this state, the fixing of each potential is released.

Second Modification

Figure 8:
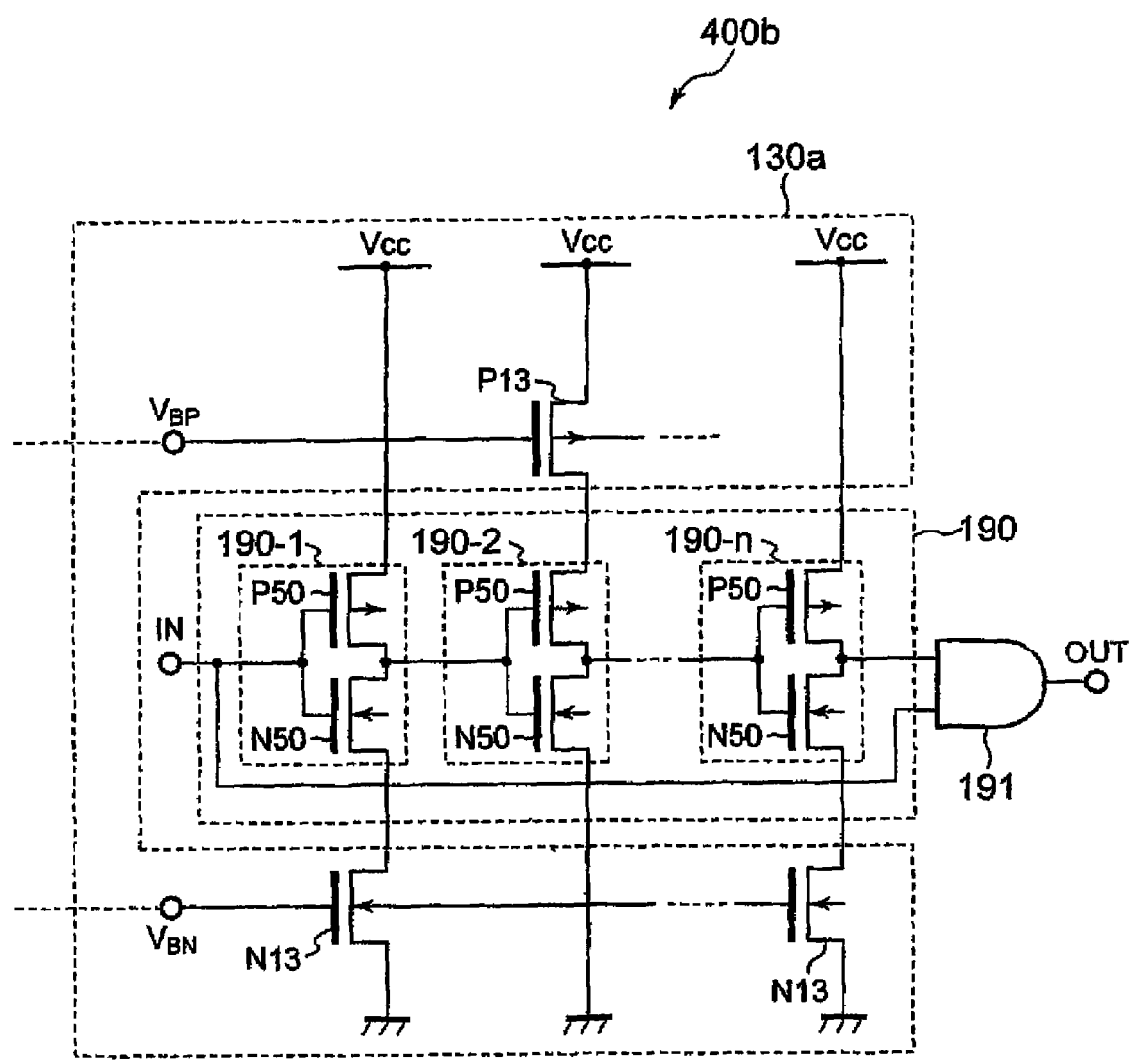
FIG. 8 is an equivalent circuit diagram showing a configuration of a pulse generator according to a further embodiment of the present invention.

FIG. 8 is an equivalent circuit diagram showing a second modification of the pulse generator 400 shown in the third preferred embodiment. A pulse generator 400b according to the present embodiment is different from the third preferred embodiment in terms of a configuration of an output unit 130a of a current source device. Namely, in the pulse generator 400b according to the present embodiment, PMOS transistors P50 that constitute odd-numbered inverter circuits of inverter circuits 190-1 through 190-n of n stages (where n: odd number) are respectively connected directly to a source voltage $V_{CC}$ without via output-stage PMOS transistors P13 of the current source device. On the other hand, NMOS transistors N50 that constitute even-numbered inverter circuits are respectively connected directly to a ground potential without via output-stage NMOS transistors N13 of the current source device. Incidentally, descriptions about the constituent parts of the current source device 200 are omitted in FIG. 8.

In the pulse generator 400b having such a configuration, an input terminal IN is set to a Low level when the pulse generator is in a halt state. Thus, the PMOS transistor P50 that constitutes the first-stage inverter circuit 190-1 assumes an ON state, so that its output is brought to a High level. As a result, the High level is inputted to the second inverter circuit 190-2 thereby to bring the NMOS transistor N50 to an ON state. Therefore, the inverter circuit 190-2 outputs a Low level therefrom. Thus, when the pulse generator is in the halt state, the potentials of the inputs and outputs of all the inverter circuits become opposite in phase. The output of an AND circuit 191 assumes a Low level because the input terminal IN is set to the Low level. The state of the potential of each part at the stop of the pulse generator corresponds to a state at the time that the input terminal IN is of the Low level upon the normal operation of the pulser generator. Thus, it corresponds to a state prior to the input of a trigger for pulse generation. Namely, since the potential of each part is fixed in such a manner that the pulse generator takes one state at the time that it is already in the normal operation, from the time when the pulse generator is in the halt state, and the supply of drive currents is started by the current source device from immediately after the start-up thereof, a desired pulse output is obtained promptly from immediately after the start-up.

While the preferred forms of the present invention have been described, it is to be understood that modifications will be apparent to those skilled in the art without departing from the spirit of the invention. The scope of the invention is to be determined solely by the following claims.

What is claimed is:

1. A current source device comprising:
a first series circuit comprising a first FET and a resistor connected in series with the first FET, said first series circuit having ends respectively connected to a source voltage and ground;
a second series circuit comprising a second FET and a third FET connected in series with the second FET, said second series circuit including a connecting point between the second and third FETs and a gate of the third FET connected to each other, and including ends respectively connected to the source voltage and ground;
a drive circuit which supplies a common drive voltage to gates of the first and second FETs; and
first and second current source circuits operated in response to first and second drive voltages, wherein gate voltages of the second and third FETs are the first and second drive voltages,
wherein said first and second current source circuits respectively include first and second current source FETs respectively operated responsive to the first and second drive voltages as gate voltages, and respective first and second start-up circuits which change the first and second drive voltages forcedly when the first and second current source FETs are brought into conduction,
wherein output currents are supplied from sources or drains of the first and second current source FETs,
wherein the first and second start-up circuits have enable signal input terminals for allowing input of enable signals supplied from outside, the first and second drive voltages rise or drop in response to the enable signals in such a manner that the first and second current source FETs are respectively brought into conduction, and
wherein the first start-up circuit includes a first drive voltage start-up FET connected to a gate of the first current source FET, a first current control FET series-connected to the first drive voltage start-up FET to control ON/OFF of a current flowing through the first drive voltage start-up FET in response to the enable signal, a first gate potential fixing FET which fixes a gate voltage of the first drive voltage start-up FET to a predetermined potential in response to the enable signal, and a first gate control FET turned ON and OFF in response to the gate voltage of the first current source FET to control the gate voltage of the first drive voltage start-up FET, and
the second start-up circuit includes a second drive voltage start-up FET connected to a gate of the second current source FET, a second current control FET series-connected to the second drive voltage start-up FET to control ON/OFF of a current flowing through the second drive voltage start-up FET in response to the enable signal, a second gate potential fixing FET which fixes a gate voltage of the second drive voltage start-up FET to a predetermined potential in response to the enable signal, and a second gate control FET turned ON and OFF in response to the gate voltage of the second current source FET to control the gate voltage of the second drive voltage start-up FET.

2. The current source device according to claim 1, wherein the second series circuit further includes a fourth FET connected to the gate of the third FET to fix the second drive voltage to a ground potential in response to the enable signal.

3. An oscillator device having the current source device described in any one of claim 1 or 2, including a ring oscillator circuit comprising a plurality of inverter circuits respectively operated with output currents supplied from the first and second current source FETs as drive current sources.

4. The oscillator device according to claim 3, wherein first potential fixing circuits which fix an output potential of first ones of the inverter circuits to a potential equivalent to a high level output when supply of currents from the current source device is stopped, and second potential fixing circuits which fix an output potential of second ones of the inverter circuits to a potential equivalent to a low level output when the supply of currents from the current source device is stopped, are alternately disposed at respective output parts of the inverter circuits.

5. A pulse generator having the current source device described in any one of claim 1 or 2, comprising:
- a delay circuit comprising a plurality of inverter circuits respectively operated with output currents supplied from the first and second current source FETs as drive current sources; and
- an AND circuit which receives both input and output signals of the delay circuit as input signals.

6. The pulse generator according to claim 5, wherein first potential fixing circuits which fix an output potential of first ones of the inverter circuits to a potential equivalent to a high level output when supply of currents from the current source device is stopped, and second potential fixing circuits which fix an output potential of second ones of the inverter circuits to a potential equivalent to a low level output when supply of currents from the current source device is stopped, are alternately disposed at respective output parts of the inverter circuits.

* * * * *